United States Patent [19]

Harada et al.

[11] Patent Number: 5,416,062
[45] Date of Patent: May 16, 1995

[54] THIN FILM SUPERCONDUCTOR WITH AN INTERLAYER ON A SILICON SUBSTRATE

[75] Inventors: Keizo Harada; Hidenori Nakanishi; Hideo Itozaki, all of Hyogo, Japan

[73] Assignee: Sumitomo Electric Industries, Ltd., Osaka, Japan

[21] Appl. No.: 173,482

[22] Filed: Dec. 27, 1993

Related U.S. Application Data

[63] Continuation of Ser. No. 806,329, Dec. 13, 1991, abandoned.

[30] Foreign Application Priority Data

Dec. 13, 1990 [JP] Japan ................................ 2-410432

[51] Int. Cl.$^6$ ............................................... B32B 9/00
[52] U.S. Cl. ..................................... 505/237; 428/688; 428/689; 428/930; 505/235; 505/701; 505/236; 505/238; 505/239
[58] Field of Search ................... 505/1, 701, 702, 703, 505/704, 235, 237, 236, 238, 239; 428/688, 689, 210, 698, 930

[56] References Cited

U.S. PATENT DOCUMENTS 5,015,623  5/1991  Scholten ................................ 505/1
5,122,509  6/1992  Beetz et al. ........................ 428/688

OTHER PUBLICATIONS

Geballe, "Paths to Higher Temp. Super Science" vol. 259, Mar. 12, 1993 pp. 1550–1551.
"Cuprate Superconductors: Record 133K achieved w/Mercury", May 10, 1993 CbeN, pp. 4–5.
Myoren, et al. Jap. Jour. of App. Phys. vol. 29, pp. L955–L957 (Jun. 1990).
Pool, "Superconductor Material Problems", Science Apr. 1, 1988, vol. 240, pp. 25–27.

*Primary Examiner*—Patrick J. Ryan
*Assistant Examiner*—Patrick Jewik
*Attorney, Agent, or Firm*—Kerkam, Stowell, Kondracki & Clarke; John C. Kerins

[57] ABSTRACT

A thin film of oxide superconductor deposited on a single crystal substrate of silicon wafer. A buffer layer of (100) or (110) oriented $Ln_2O_3$, in which Ln stands for Y or lanthanide elements is interposed between the thin film of oxide superconductor and the silicon wafer. A surface of silicon wafer is preferably cleaned satisfactorily by heat-treatment in vacuum before the buffer layer is deposited. An under-layer of metal oxide; $ZrO_2$, YSZ or metal Y, Er is preferably interposed between the $Ln_2O_3$ buffer layer and the silicon wafer.

4 Claims, No Drawings

THIN FILM SUPERCONDUCTOR WITH AN INTERLAYER ON A SILICON SUBSTRATE

This application is a continuation of application Ser. No. 07/806,329, filed Dec. 13, 1991, now abandoned.

BACKGROUND OF THE INVENTION

1. Field of The Invention

The present invention relates to an improved thin film of oxide superconductor and a process for preparing the same, more particularly, an improved thin film of Cu-containing compound oxide such as YBCO having controlled crystal orientation deposited on a substrate of silicon wafer and a process for preparing the same.

2. Description of the Related Art

Superconducting phenomenon has been explained as unique phenomenon which can be observed only at extremely low temperatures which can be realized with liquid helium. However, a new type superconducting compound oxide of $(La, Sr)_2CuO_4$ which exhibits the superconductivity at 30 K. was reported in 1986 by Bednorz and Müller (Z. Phys. B64, 1986, 189). Then, another superconducting material of $YBa_2Cu_3O_y$ having higher critical temperature of about 90 K. was reported in 1987 by C. W. Chu et al. (Physical Review letters, Vol. 58, No. 9, p. 908) and then Maeda et al. reported so-called bismuth type compound oxide superconductor having the critical temperature of about 100 K. in 1988 (Japanese Journal of Applied Physics. Vol. 27, No. 2, p. 1209 to 1210).

These superconducting compound oxides are expected to be applied to actual uses since the superconducting phenomenon can be realized with relatively cheap cryogen of liquid nitrogen. In early stage of development, these superconducting compound oxides were prepared in a sintered body form by solid reaction and now, it has become possible to prepare thin films of high quality from these superconducting compound oxide materials.

When thin films of oxide superconductor are used in electronics, it is requested to prepare their thin film whose crystals are well-oriented. In fact, oxide superconductors possess high anisotropy in their superconducting properties and hence it is necessary to control crystal orientation at film-forming stage so as to adjust to applications. In the thin films of oxide superconductors, higher current flows to a direction which is perpendicular to c-axis. For example, when the thin film of oxide superconductor is used as superconducting wiring lines in a circuit, it is required to pass superconducting current along a direction which is in parallel with a surface of substrate. In this case, the c-axis of crystals of the thin film must be perpendicular with respect to the surface of substrate. In other words, (110) oriented thin films of oxide superconductor are required in these applications. In another application such as layered SIS (superconductor-insulator-superconductor) type device, it is required to pass superconducting current along a direction which is perpendicular to the surface of substrate. In this case, the c-axis of crystals of the thin film prepared must be perpendicular to the surface of substrate. In other words, (100) oriented thin film or (110) oriented thin films of oxide superconductor is required in these applications.

Importance of selection of deposition plane in substrate or optimization of deposition conditions, particularly substrate temperature for realizing a desired crystal orientation in a thin film of oxide superconductor was reported by many papers including Enomoto et al., Japanese Journal of Applied Physics, Vol. 26, No. 7, July 1987, pp.L1248–L1250, Asano et al. in Japanese Journal of Applied Physics, Vol. 28, No. 6, June 1989, pp.L981–L983 or the like.

It is also known that each of oxide superconductors possesses a complicated crystal structure and hence a desired crystal orientation can be realized only under a special deposition condition. In fact, the substrate on which a thin film of oxide superconductor is deposited must be selected from such substrates that have well-matched lattice constants with oxide superconductors and do not diffuse or migrate into the superconductor. From this point of view, MgO (100) single crystal or $SrTiO_3$ (100) or (110) single crystal are used as the substrate.

Use of these substrates, however, has a demerit in industrial applications of oxide superconductors because they are costly material and are not produced in mass production. Still more, since diameters of these oxide single crystal substrates are limited, it is impossible to produce a thin film of oxide superconductor having a large area. It is also proposed to used, as substrate, a silicon single crystal substrate (Si wafer) which is less expensive and is available stably on market so as to prepare a thin film of oxide superconductor thereon.

However, it is known that, when a thin film of oxide superconductor is deposited on the silicon single crystal substrate, superconducting properties of the deposited thin film are seriously deteriorated or lost due to chemical reaction between oxide of which the superconducting thin film is made and silicon of which the substrate is made.

In order to solve this problem, it is proposed to interpose a buffer layer between the substrate and the thin film of oxide superconductor so as to prevent the diffusion. However, all of known buffer layers are not satisfactory to control or adjust crystal orientation of a thin film of oxide superconductor deposited on a silicon wafer.

Therefore, an object of the present invention is to solve the problem and to provide a process which permits to prepare a thin film of oxide superconductor having a desired crystal orientation on a substrate of silicon wafer.

SUMMARY OF THE INVENTION

The present invention provides a thin film of oxide superconductor deposited on a single crystal substrate of silicon wafer, characterized by a buffer layer of (100) or (110) oriented $Ln_2O_3$, in which Ln stands for Y or lanthanide elements, interposed between the thin film of oxide superconductor and the silicon wafer.

An under-layer as an additional buffer layer is preferably interposed between the buffer layer of $Ln_2O_3$ and the silicon wafer. In any case, the thin film of oxide superconductor is deposited directly on and is contacted with the buffer layer of $Ln_2O_3$. The under-layer may be made of metal oxide such as $ZrO_2$ or yttrium stabilized zirconia (YSZ) or metal such as Y and lanthanide elements.

The present invention provides also a process for preparing a thin film of oxide superconductor on a single crystal substrate of silicon wafer, comprising by the steps of depositing a buffer layer of (100) or (110) oriented $Ln_2O_3$, in which Ln stands for Y or lanthanide elements, on the silicon wafer and thereafter depositing the thin film of oxide superconductor on the buffer layer.

A surface of the silicon wafer is preferably cleaned satisfactorily before the buffer layer of (100) or (110) oriented $Ln_2O_3$ is deposited. This cleaning of the surface of silicon wafer can be effected by heat-treatment in vacuum effected under a pressure of lower than $1 \times 10^{-6}$ Torr and at a temperature of above 900° C. Above-mentioned under-layer is preferably deposited on said silicon wafer before the buffer layer of $Ln_2O_3$ is deposited. The buffer layer of $Ln_2O_3$ and the under-layer of metal oxide such as $ZrO_2$ or YSZ or metal such as Y and lanthanide elements can be prepared by vacuum deposition method, while the thin film of oxide superconductor is preferably prepared by sputtering method. Successive deposition operations of both of the buffer layer of $Ln_2O_3$ (if necessary the under-layer) and the thin film of oxide superconductor are preferably carried out in an identical vacuum chamber.

An essence of the present invention resides in that a buffer layer of $Ln_2O_3$ having a layered structure is deposited on a silicon single crystal substrate before a thin film of oxide superconductor is deposited. The term "buffer layer" means a layer of $Ln_2O_3$ on which a thin film of oxide superconductor is deposited directly.

As is stated above, it is known that effective thin films of all oxide superconductors can be deposited only on predetermined crystalline surfaces and that diffusion of silicon into the thin film of oxide superconductor result in deterioration and loss of superconducting properties. Several materials for the buffer layer are proposed. Known materials for the buffer layer are selected from those that can produce crystalline surfaces which are suitable for realizing thin films of oxide superconductor thereon and which function as a diffusion barrier to silicon and constituent elements of oxide superconductor. In fact, known buffer layers are satisfactory to prevent diffusion of silicon but contribute little to crystal growth of the thin film of oxide superconductor to be deposited directly thereon.

According to the present invention, the buffer layer on which a thin film of oxide superconductor is deposited is made of a material which does not or little react with superconductor, has well-matched lattice constants with crystals of the superconductor and also has a predetermined crystal orientation, so that the thin film of oxide superconductor deposited on the buffer layer grows epitaxially and possesses a well-ordered crystal orientation. Inventors of the present invention found that such epitaxial growth can be realized by selecting, as the buffer layer, $Ln_2O_3$, in which "Ln" stands for Y or lanthanide elements such as La, Er.

As a substrate on which thin films grow, (100) single crystal silicon wafer is usually used because of cost and easy of matching in lattice constants. A thin film deposited on this (100) single crystal silicon wafer is expected to have identical crystal orientation of (100). However, actually obtained thin film by known technique doesn't possesses crystal orientation of (100) but possesses a crystal orientation of (111). This fact is reported by Fukomoto et al. in Appl. Phys. Lett. 55(4) 24, July 1989, pp 360–361. This (111) oriented thin film, however, is not suitable to effect epitaxial growth of oxide superconductor because (100) or (110) oriented thin films is demanded in actual applications of thin films of oxide superconductor.

The (100) or (110) oriented thin film as a buffer layer can be prepared from $Ln_2O_3$ according to the present invention.

In the process according to the present invention, one of following methods is preferably adopted in order to realize the (100) or (110) oriented thin film:

In a first method, a surface of a silicon wafer to be used is cleaned satisfactorily. In practice, this cleaning operation can be carried out, for example, by heat-treatment in a high-vacuum chamber with observing a surface condition of a silicon wafer. This heat-treatment can be carried out until a characteristic "2×1" structure which means that the surface becomes clean is observed by a reflection high-energy electron diffraction (RHEED) analyzer. In practice, the heat-treatment is carried out preferably at a pressure of lower than $1 \times 10^{-6}$ and at a temperature of above 900° C.

In the second method, an additional buffer layer (hereinafter, under-buffer layer) is interposed between the $Ln_2O_3$ buffer layer on which a thin film of oxide superconductor is deposited directly and the silicon wafer, in other words, the buffer layer has a two-layered structure. The under-buffer layer used as additional buffer layer is selected so as to satisfy such two requirements that the under-layer is well-matched with the (100) crystal orientation of silicon wafer and that the under-layer possesses a (100) or (110) plane. This under-buffer layer can be made of oxide such as $ZrO_2$, yttrium stabilized zirconia (YSZ) or metal elements such as Y, Er, Pr, Dy, Ho, Yb, Gd, Sm or the like.

Crystal orientation of the under-layer on which the $Ln_2O_3$ buffer layer is deposited directly can be controlled by using one or both of the above-mentioned methods.

As a conclusion, according to the present invention, thin films of oxide superconductors having controlled crystal orientation can be prepared on a silicon wafer substrate. Thin films of oxide superconductors according to the present invention possesses effective crystalline structure which starts just from an interface with the buffer layer and shows improved critical current density (Jc).

Use of silicon single crystal wafer as a substrate is very advantageous in the field of electronics devices since a variety of fine processing technology of silicon wafer are known and applicable in addition to such merits that single crystal wafer is less expensive and is available stably on market. And also, a thin film having a large area can be prepared because a silicon wafer having a large diameter is available on market.

DESCRIPTION OF THE PREFERRED EMBODIMENTS

Now, the present invention will be described with reference to Examples, but the scope of the present invention should not be limited thereto.

EXAMPLE 1

Six silicon wafers each having a diameter of 3 inch were used. Three silicon wafers were subjected to cleaning treatment which was effected at 900° C. under $5 \times 10^{-7}$ Torr for 10 minute until the characteristic "2×1" structure was observed on the silicon wafer by RHEED.

Then, an under buffer layer of $ZrO_2$ or Y was deposited on two silicon wafer which were not heat-treated and on two silicon wafer which were cleaned by the heat-treated.

The under buffer layers of $ZrO_2$ and Y were deposited by vacuum deposition technique. In the case of two cleaned silicon wafer, vacuum deposition was carried out continuously in the same chamber as the cleaning chamber without exposing the heat-treated silicon wafers to air. Film-forming conditions of the under buffer layers are summarized in table 1

TABLE 1

| Buffer layer | $ZrO_2$ | Y |
| --- | --- | --- |
| vapour source | sintered $ZrO_2$ | metal Y |
| substrate temperature (°C.) | 800 | 700 |
| pressure (Torr) | $5 \times 10^{-6}$ | $5 \times 10^{-7}$ |
| film thickness (Å) | 200 | 50 |

The results of six silicon wafers are summarized in Table 2 in which film-growth planes of obtained buffer layers are also shown.

TABLE 2

| Sample No. | Cleaning treatment | buffer layer | growth plane |
| --- | --- | --- | --- |
| 1 | no | none | — |
| 2 | no | $ZrO_2$ | (100) |
| 3 | no | Y | (100) |
| 4 | yes | none | — |
| 5 | yes | $ZrO_2$ | (100) |
| 6 | yes | Y | (100) |

Then, an upper buffer layer of $Y_2O_3$ was deposited by vacuum evaporation technique on the six wafers obtained under the condition shown in Table 3.

TABLE 3

| vapour source | metal Y |
| --- | --- |
| substrate temperature (°C.) | 760° C. |
| partial pressure of oxygen (Torr) | $5 \times 10^{-4}$ |
| film thickness (Å) | 300 |

Crystal orientation of upper buffer layers of $Y_2O_3$ obtained under the above condition was evaluated by X-ray diffraction analyzer. The results are summarized in Table 4.

TABLE 4

| Sample No | film growth plane |
| --- | --- |
| 1 | (111) |
| 2 | (100) |
| 3 | (110) |
| 4 | (110) |
| 5 | (100) |
| 6 | (110) |

Finally, a thin film of Y—Ba—Cu oxide superconductor was deposited on the resulting upper buffer layer by sputtering technique under conditions shown in Table 5:

TABLE 5

| composition in a target | $Y_1Ba_2Cu_4O_x$ |
| --- | --- |
| substrate temperature (°C.) | 700 |
| sputtering gas | Ar + $O_2$ (20 vol %) |
| pressure (Torr) | 0.1 |
| film thickness (Å) | 2,000 |

Superconducting properties and crystal orientation of the resulting six thin films of oxide superconductor are summarized in Table 6. The critical current density (Jc) was determined at liquid nitrogen temperature with current passing along a direction which is perpendicular to c-axis of crystal of which the thin film is made.

TABLE 6

| Sample No. | Critical temperature (K.) | Critical current density (A/cm²) | Orientation of crystal |
| --- | --- | --- | --- |
| 1 | 78 | $1 \times 10^2$ | polycrystal |
| 2 | 85 | $8 \times 10^5$ | (001) |
| 3 | 84 | $5 \times 10^5$ | (110) |
| 4 | 85 | $4 \times 10^5$ | (110) |
| 5 | 89 | $2 \times 10^6$ | (001) |
| 6 | 88 | $1 \times 10^6$ | (110) |

EXAMPLE 2

The same silicon (100) single crystal substrate as Example 1 was used to prepare a thin film of oxide superconductor.

Film-deposition plane of the silicon wafer was cleaned or heat-treated under the same condition as Example 1 and then an under-layer of YSZ was deposited thereon by vacuum deposition technique under the conditions shown in Table 7 in which a film-growth plane of obtained under buffer layer is also shown.

TABLE 7

| vapour source | sintered YSZ |
| --- | --- |
| substrate temperature (°C.) | 800 |
| pressure (Torr) | $5 \times 10^{-6}$ |
| film thickness (Å) | 300 |
| crystal orientation | (100) |

Then, an buffer layer of $Er_2O_3$ was deposited by vacuum evaporation technique on the under-layer of YSZ deposited on the silicon wafer under the condition shown in Table 8.

TABLE 8

| vapour source | metal Er |
| --- | --- |
| substrate temperature (°C.) | 740° C. |
| partial pressure of oxygen (Torr) | $5 \times 10^{-4}$ |
| film thickness (Å) | 300 |

It was confirmed that the resulting upper buffer layers of $Er_2O_3$ is a crystalline layer having a crystal orientation of (100).

Finally, a thin film of Y—Ba—Cu oxide superconductor was deposited on the resulting upper buffer layer of $Er_2O_3$ by sputtering technique under conditions shown in Table 9. In this Example, two samples were prepared at the substrate temperature of 700° C. (Sample 7) and 600° C. (Sample 8).

TABLE 9

| composition in a target | $Y_1Ba_2Cu_4O_x$ |
| --- | --- |
| substrate temperature (°C.) | 700 and 600 |
| sputtering gas | Ar + $O_2$ (20 vol %) |
| pressure (Torr) | 0.1 |
| film thickness (Å) | 2,000 |

Superconducting properties and crystal orientation of the resulting thin films of oxide superconductor are summarized in Table 10. The critical current density (Jc) was determined at liquid nitrogen temperature with current passing along a direction which is perpendicular to c-axis of crystal of which the thin film is made.

TABLE 10

| Sample No. | Critical temperature (K.) | Critical current density (A/cm²) | Orientation of crystal |
| --- | --- | --- | --- |
| 7 | 88 | $1 \times 10^6$ | (001) |
| 8 | 87 | $9 \times 10^5$ | (100) |

We claim:

1. A thin film of a Y—Ba—Cu oxide superconductor deposited on a single crystal substrate of silicon wafer wherein a buffer layer of (100) or (110) oriented $Ln_2O_3$, in which Ln stands for Y or lanthanide elements, is interposed between said thin film of said Y—Ba—Cu oxide superconductor and said silicon wafer, wherein an under-layer is interposed between said buffer layer of $Ln_2O_3$ and said silicon wafer as an additional buffer layer, and wherein said under-layer is a layer made of a metal selected from the group consisting of Y and lanthanide elements.

2. The thin film set forth in claim 1, wherein said buffer layer of $Ln_2O_3$ and said under-layer are vacuum deposited layers.

3. The thin film set forth in claim 1, wherein said thin film of oxide superconductor is a sputtered thin film.

4. The thin film set forth in claim 1, wherein said buffer layer of $Ln_2O_3$, said under-layer and said thin film of Y—Ba—Cu oxide superconductor comprise layers which are successively deposited within a single vacuum chamber.

* * * * *